(12) United States Patent
Li (10) Patent No.: US 11,395,421 B2
(45) Date of Patent: Jul. 19, 2022

(54) SLIDING FLEXIBLE DISPLAY DEVICE (71) Applicant: Wuhan China Star Optoelectronics Semiconductor Display Technology Co., Ltd., Hubei (CN)

(72) Inventor: Wenqi Li, Hubei (CN)

(73) Assignee: Wuhan China Star Optoeleetronics Semiconductor Display Technology Co., Ltd., Wuhan (CN)

( * ) Notice: Subject to any disclaimer, the term of this patent is extended or adjusted under 35 U.S.C. 154(b) by 31 days.

(21) Appl. No.: 16/980,864

(22) PCT Filed: Jun. 17, 2020

(86) PCT No.: PCT/CN2020/096611
§ 371 (c)(1),
(2) Date: Sep. 15, 2020

(87) PCT Pub. No.: WO2021/237828
PCT Pub. Date: Dec. 2, 2021

(65) Prior Publication Data
US 2021/0378115 A1    Dec. 2, 2021

(30) Foreign Application Priority Data
May 26, 2020   (CN) .......................... 202010457456.6

(51) Int. Cl.
*H05K 7/02*     (2006.01)
*H05K 7/04*     (2006.01)
*H05K 5/02*     (2006.01)
*H05K 5/00*     (2006.01)

(52) U.S. Cl.
CPC ......... *H05K 5/0217* (2013.01); *H05K 5/0017* (2013.01)

(58) Field of Classification Search
USPC ......................................... 361/807, 809, 810
See application file for complete search history.

(56) References Cited

U.S. PATENT DOCUMENTS

| 10,152,086 | B2 * | 12/2018 | Choi | G06F 1/1652 |
| 10,403,177 | B2 * | 9/2019 | Lim | H04M 1/0268 |
| 2014/0380186 | A1 * | 12/2014 | Kim | G06F 1/1677 |
| | | | | 715/746 |
| 2015/0062927 | A1 * | 3/2015 | Hirakata | H05K 5/0017 |
| | | | | 362/362 |

(Continued)

FOREIGN PATENT DOCUMENTS

| AU | 6373101 | 4/2002 |
| CN | 1347233 | 5/2002 |

(Continued)

*Primary Examiner* — Hung S. Bui (57) ABSTRACT

A sliding flexible display device is provided. The sliding flexible display device includes a flexible display panel and a sliding component for carrying the flexible display panel. The sliding component includes a plurality of sliding modules that may slide relatively. The display device has a contraction and stretching function under action of the sliding modules. The display device may be freely changed from a flat state to a retracted state and a folded state. The flexible display panel exhibits different folding forms as the states change, and achieves display screen continuity of the flexible display panel.

17 Claims, 5 Drawing Sheets (56) References Cited

U.S. PATENT DOCUMENTS

2018/0233695 A1    8/2018  Wang et al.
2020/0109838 A1    4/2020  Hirakata et al.

FOREIGN PATENT DOCUMENTS

| | | |
|---|---|---|
| CN | 105379420 | 3/2016 |
| CN | 106601129 | 4/2017 |
| CN | 106711349 | 5/2017 |
| CN | 110910768 | 3/2020 |
| CN | 110995899 | 4/2020 |
| KR | 10-2007206 | 8/2019 |

\* cited by examiner

SLIDING FLEXIBLE DISPLAY DEVICE

RELATED APPLICATIONS

This application is a National Phase of PCT Patent Application No. PCT/CN2020/096611 having International filing date of Jun. 17, 2020, which claims the benefit of priority of Chinese Patent Application No. 202010457456.6 filed on May 26, 2020. The contents of the above applications are all incorporated by reference as if fully set forth herein in their entirety.

FIELD AND BACKGROUND OF THE INVENTION

The present invention relates to a field of display technology, and more particularly, to a sliding flexible display device.

With the development of display technology, folding flexible display devices have gradually entered people's vision. Currently, many companies have developed prototypes of folding display devices. Flexible folding mobile phones and flexible folding tablet computers are most commonly seen. These display devices achieve a combination of portability and large display screens through folding characteristics. Folding screens mainly include an inner folding type and an outer folding type. Users need to manually bend the display devices to change their shapes during use, so it is more cumbersome to operate the display devices. Meanwhile, ultimate dynamic continuity of flexible displays cannot be achieved, leading to poor user experience.

SUMMARY OF THE INVENTION

In the folding process of the fold-inward or fold-outward folding display screen, the picture of the dynamic continuity of the flexible display screen are damaged, resulting in the bad quality of screen display, the user experience is poor.

A sliding flexible display device comprises a flexible display panel and a sliding component configured to carry the flexible display panel. The sliding component comprises a plurality of sliding modules, and a sliding connection part is disposed between the sliding modules. The sliding flexible display device comprises a flat state, a retracted state and a folded state based on different working states of the sliding flexible display device.

When the sliding flexible display device is in the flat state, the plurality of sliding modules are arranged in parallel, and the flexible display panel is flattened and disposed on a flat surface formed by the plurality of sliding modules or when the sliding flexible display device is in the retracted state, a part or a whole part of the sliding module is on the back side of another part of the sliding module, and a part of the flexible display panel is folded and disposed between two adjacent sliding modules or when the sliding flexible display device is in the folded state, the plurality of sliding modules are arranged in stacks, and the flexible display panel is partially folded and disposed between the two adjacent sliding modules.

In one embodiment, a protective layer disposed between the flexible display panel and the sliding component, the protective layer is configured to prevent friction of the sliding component or collision with the flexible display panel.

In one embodiment, the protective layer is a band-shaped layer along both ends of the sliding component, or is a layer covering an entire surface of the sliding component.

In one embodiment, the sliding flexible display device, when the sliding flexible display device is in the folded state, a topmost of the sliding module is a first sliding module. The protective layer and the flexible display panel corresponding to the first sliding module are fixed on the first sliding module and at least part of the protective layer corresponding to the sliding module excluding the first sliding module and at least part of the flexible display panel are detachably disposed.

In one embodiment, along a sliding direction of the sliding component, both ends of the flexible display panel are connected to a stretchable layer, and the stretchable layer is configured to buffer a tensile force of the flexible display panel when the sliding component is pulled by an external force.

In one embodiment, along the sliding direction of the sliding component, both ends of the flexible display panel are directly connected to a spring disposed on a backside of the flexible display panel through the stretchable layer or the protective layer.

In one embodiment, at least in a detachable area of the flexible display panel and the sliding component, the sliding component is configured to carry a surface of the flexible display panel, both sides of the protective layer, and the surface of the flexible display panel facing the sliding component are with a magnetic layer to ensure that there is magnetic attraction between the sliding component, the protective layer, and the flexible display panel.

In one embodiment, the sliding modules comprises a first sliding module, a second sliding module adjacent to the first sliding module in a flat state, and a third sliding module adjacent to the second sliding module and when the sliding flexible display device is in the folded state, the third sliding module is between the first sliding module and the second sliding module, and a part of the flexible display panel is located on the first sliding module, another part of the flexible display panel is folded between the first sliding module and the third sliding module.

In one embodiment, the protective layer comprises a first protective layer and a second protective layer, the first protective layer corresponds to the first sliding module, and the second protective layer corresponds to the second sliding module and the third sliding module and the first protective layer extends to an edge region where the first sliding module and the second sliding module meet, and the first protective layer and the first sliding module are detachable in the edge region.

In one embodiment, the second sliding module in a flat state close to one end of the first sliding module is disposed with a retracting component, and one end of the second protective layer is connected to the retracting component.

In one embodiment, two opposite sides of the second sliding module are connected to a clamping slot through an elastic member, the clamping slot and a side of second sliding module are parallel, an opening of the clamping slot faces the flexible display panel, and the edge of the flexible display panel is disposed in the clamping slot.

In one embodiment, the first sliding module and the second sliding module are connected through a first slidably connecting rod, and the first sliding module is disposed with a first sliding path, and one end of the first slidably connecting rod is slidably connected to the first sliding module through the first sliding path.

In one embodiment, the second sliding module and the third sliding module are connected through a second slidably connecting rod, and the second sliding module is disposed with a second sliding path, and one end of the second slidably connecting rod is slidably connected to the second sliding module through the second sliding path.

In one embodiment, the sliding modules comprises a first sliding module, a second sliding module adjacent to the first sliding module in a flat state, and a third sliding module adjacent to the second sliding module and when the sliding flexible display device is in the folded state, the second sliding module is between the first sliding module and the third sliding module, and a part of the flexible display panel is located on the first sliding module, another part of the flexible display panel is folded between the first sliding module and the second sliding module, and folded between the second sliding module and the third sliding module.

In one embodiment, the first sliding module and the second sliding module are connected through a first slidably connecting rod, and the first sliding module is disposed with a first sliding path, and one end of the first slidably connecting rod is slidably connected to the first sliding module through the first sliding path.

In one embodiment, the second sliding module and the third sliding module are connected through a second slidably connecting rod, and the second sliding module is disposed with a second sliding path, and one end of the second slidably connecting rod is slidably connected to the second sliding module through the second sliding path.

In one embodiment, the sliding modules comprises a first sliding module, a second sliding module adjacent to the first sliding module in a flat state, and a third sliding module adjacent to the second sliding module, when the sliding flexible display device is in the folded state, the second sliding module and the third sliding module are disposed side by side on a back side of the first sliding module and a part of the flexible display panel is located on the first sliding module, another part of the flexible display panel is folded between the first sliding module and the second sliding module, and folded between the first sliding module and the third sliding module.

In one embodiment, the second sliding module and the first sliding module are connected through a first slidably connecting rod, the third sliding module and the first sliding module are connected through the second slidably connecting rod and the first sliding module is disposed with a common sliding path, one end of the first slidably connecting rod is slidably connected to the first sliding module through the common sliding path, and one end of the second slidably connecting rod is slidably connected to the first sliding module through the common slide path.

In one embodiment, along a sliding direction of the sliding component, two opposite ends of the flexible display panel in the flat state are disposed with a stretchable component, and the stretchable component is configured to apply an external force to the sliding flexible display device, and thus the sliding flexible display device in unfolded state is changed.

A sliding flexible display device comprises a flexible display panel and a sliding component configured to carry the flexible display panel, the sliding component comprises a first sliding module, a second sliding module, and a third sliding module, the sliding flexible display device comprises a flat state, a retracted state, and a folded state based on different working states of the sliding flexible display device and when the sliding flexible display device is in the retracted and the folded state, the flexible display panel is partially folded and disposed between the second sliding module and the first sliding module, or disposed between the first sliding module and the third sliding module, or disposed between the second sliding module and the third sliding module.

BRIEF DESCRIPTION OF THE SEVERAL VIEWS OF THE DRAWINGS

In the embodiments, the drawings configured in the description of the embodiments will be briefly described below. It is obvious that the drawings in the following description are only some embodiments. Other drawings may also be obtained from those skilled persons in the art based on these drawings without paying any creative effort.

DESCRIPTION OF SPECIFIC EMBODIMENTS OF THE INVENTION

The descriptions of the following embodiments refer to attached drawings, and to illustrate specific embodiments that can be implemented in the present invention. Directional terms mentioned in this application, such as "up," "down," "forward," "backward," "left," "right," "inside," "outside," "side," etc., are merely indicated the direction of the drawings. Therefore, the directional terms are used for illustrating and understanding of the application rather than limiting thereof. In the figure, components with similar structures are indicated by the same reference numerals.

In one embodiment, a sliding flexible display device comprises a flexible display panel with retracting function that fully gives play to ultimate flexibility of the flexible display panel. A dynamic continuity of a display screen of the sliding flexible display device and user experience are greatly improved.

First Embodiment

As shown in FIGS. 1 to 6, in one embodiment, a sliding flexible display device 10 comprises a flexible display panel 11 and a sliding component 12 configured to carry the flexible display panel 11. The sliding component 12 comprises a first sliding module 121, a second sliding module 122, and a third sliding module 123. The first sliding module 121 and the second sliding module 122 are slidably connected, and the second sliding module 122 and the third sliding module 123 are slidably connected. It should be noted that, in this embodiment, through providing the sliding component 12 and making use of a relative sliding relationship between the three sliding modules, a transition of the sliding flexible display device 10 from a flat state to a retracted state and a folded state is achieved. In a process of retraction and folding, the flexible display panel 11 bends, and fully gives play to ultimate flexibility of the flexible display panel 11. Moreover, dynamic continuity of a display screen of the sliding flexible display device 10 and user experience are greatly improved.

Figure 1:
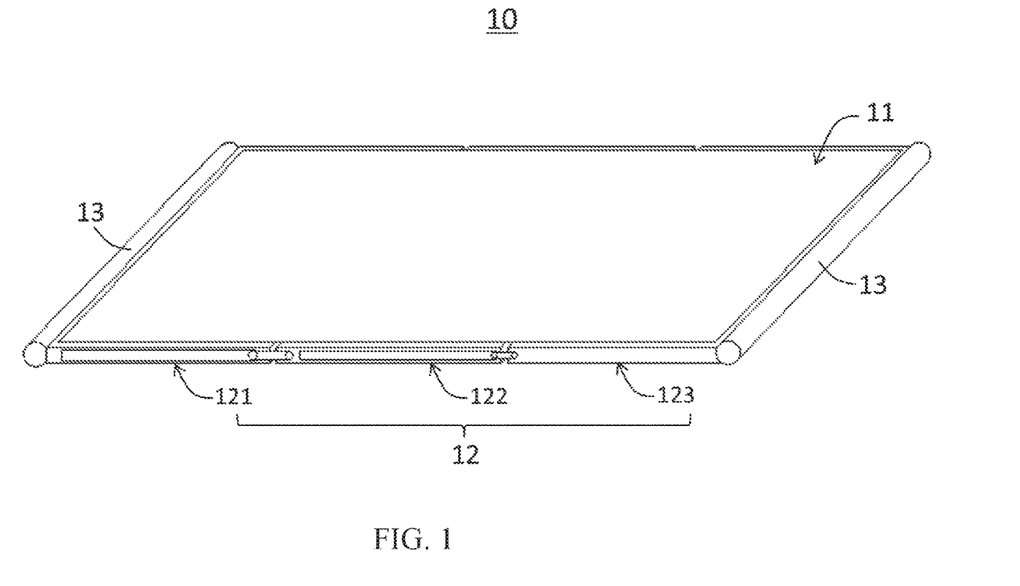
FIG. 1 is a schematic view of a sliding flexible display device disposed in a flattened state in a first embodiment of the present disclosure.

When the sliding flexible display device 10 is in the flat state, the second sliding module 122 and the first sliding module 121 are adjacent and arranged in parallel. The third sliding module 123 and the second sliding module 122 are adjacent and arranged in parallel, and the flexible display panel 11 is flattened and disposed on a flat surface formed by the plurality of sliding modules. At this time, the sliding flexible display device 10 has the largest display area so as to provide a better visual display effect.

Figure 2:
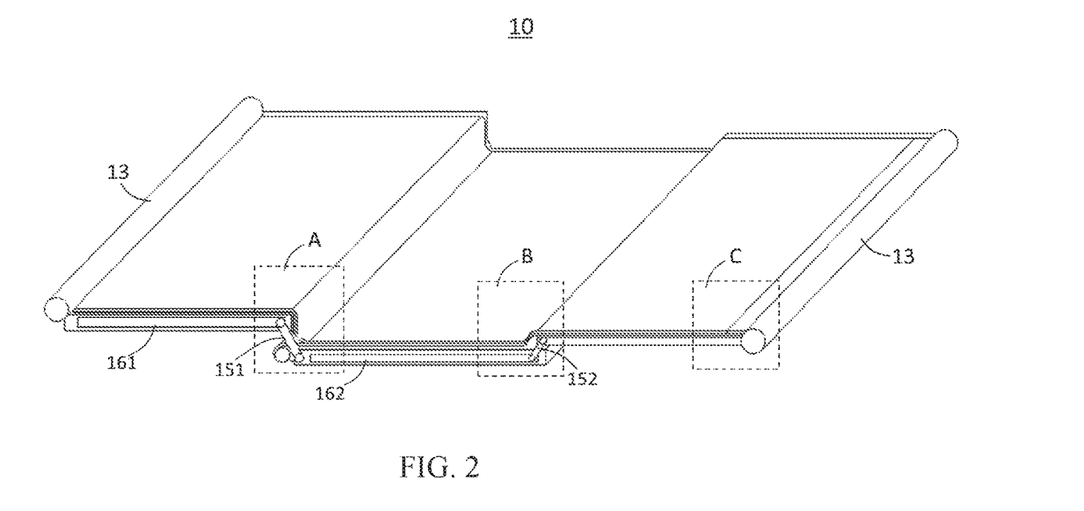
FIG. 2 is a schematic view of the sliding flexible display device disposed in an initially retracted state in the first embodiment of the present disclosure.

When the sliding flexible display device 10 is in the retracted state, the second sliding module 122 slides gradually toward a back side of the first sliding module 121, the third sliding module 123 gradually slides to between the first sliding module 121 and the second sliding module 122, an area of the flexible display panel 11 corresponding to the first sliding module 121 is fixed relative to the first sliding module 121, areas of the flexible display panel 11 corresponding to the second sliding module 122 and the third sliding module 123 are gradually recovered to the back side of the first sliding module 121 in a retracting process. During retracting of the sliding flexible display device 10, its display area is gradually decreased, and space occupied by itself is also gradually decreased.

Figure 6:
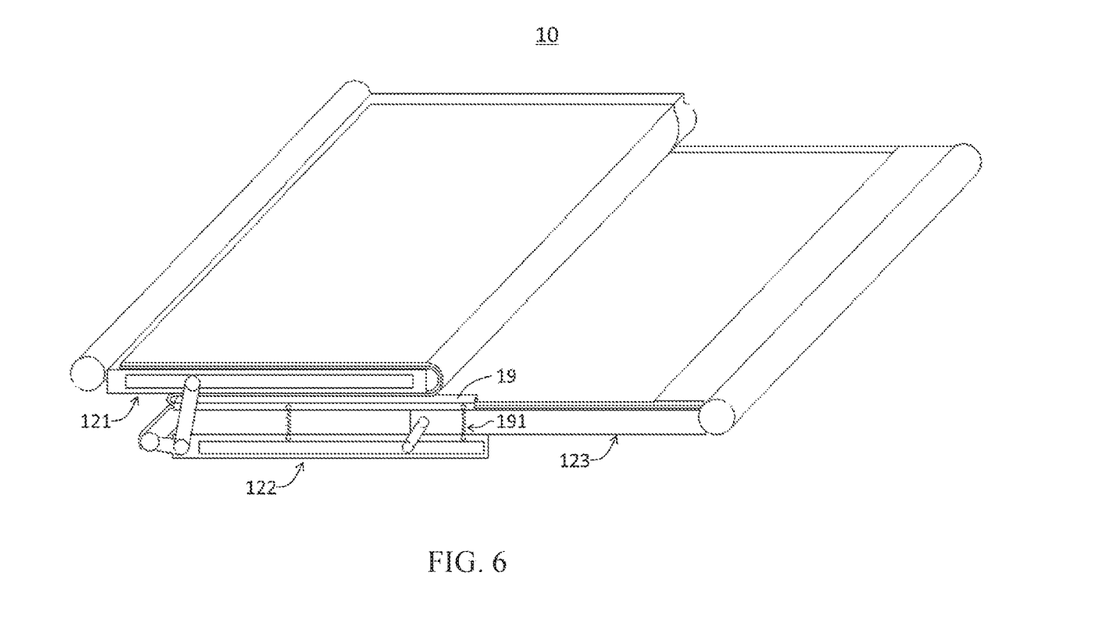
FIG. 6 is a schematic view of the sliding flexible display device disposed in a retracted state in the first embodiment of the present disclosure.

When the sliding flexible display device 10 is in the folded state, the third sliding module 123 is between the first sliding module 121 and the second sliding module 122, the area of the flexible display panel 11 corresponding to the first sliding module 121 is fixed relative to the first sliding module 121, and the areas of the flexible display panel 11 corresponding to the second sliding module 122 and the third sliding module 123 are folded between the first sliding module 121 and the third sliding module 123. At this time, the display area of the sliding flexible display device 10 reaches a minimum, and only an area of the flexible display panel above the first sliding module 121 performs a display function. Space occupied by the entire sliding flexible display device 10 reaches a minimum, and a portable feature is realized.

Optionally, a protective layer 14 is disposed between the flexible display panel 11 and the sliding component 12. The protective layer 14 is configured to prevent the sliding component from rubbing or hitting the flexible display panel 11, that is, the flexible display panel 11 is protected during the retracting or folding of the sliding flexible display device 10.

Figure 3:
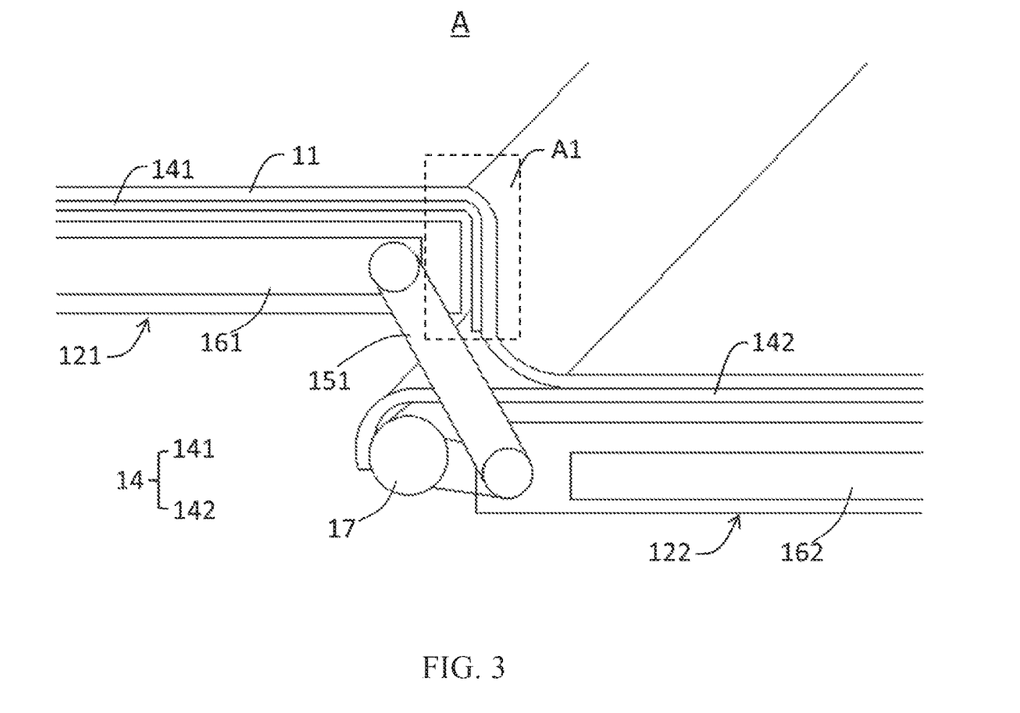
FIG. 3 is a partial schematic view of area A of the sliding flexible display device shown in FIG. 2.

Optionally, the protective layer 14 comprises a first protective layer 141 corresponding to the first sliding module 121 and a second protective layer 142 corresponding to the second sliding module 122 and the third sliding module 123. The first protective layer 141 extends to an edge area where the first sliding module 121 and the second sliding module 122 border, that is, A1 area, and the first protective layer 141 in the A1 area and the first sliding module 121 are detachable. Except the A1 area, the first protective layer 141 and the first sliding module 121 are fixed. It should be noted that in the retracted and folded state of the sliding flexible display device 10, the first protective layer 141 in the A1 area naturally hang down and is placed between sides of the flexible display panel 11 and the first sliding module 121 to play a protective role. Two opposite ends of the second protective layer 142 are fixed to opposite ends of a flat surface formed by the second sliding module 122 and the third sliding module 123 in a flattened state. The second protective layer 142 is detachable relative to a carrying surface of the second sliding module 122 and a carrying surface of the third sliding module 123, so that in the retracted and folded state of the sliding flexible display device 10, the second protective layer 142 exerts its protective effect as the flexible display panel 11 is bent.

Optionally, the protective layer is a band-shaped layer disposed along both ends of the sliding component 12, or is a layer covering an entire surface of the sliding component 12. It should be understood that, when the protective layer 14 is the band-shaped layer, the flexible display panel 11 is lifted by the protective layer 14 and does not directly contact the sliding component, and thus the protective layer 14 achieves its protective effect, while consumables of the protective layer 14 are reduced. When the protective layer 14 is a full-face layer, the flexible display panel 11 and the sliding component 12 surface may be completely separated to provide comprehensive protection for the flexible display panel 11.

Optionally, along a sliding direction of the sliding component 12, a pulling component 13 is disposed at both ends of the sliding flexible display device 10, and the pulling component 13 may be a rod-like structure or groove-like structure fixed to both ends of the sliding flexible display device 10. The pulling component 13 is configured to facilitate the user to apply an external force to the sliding flexible display device 10 to change its unfolded state.

Optionally, one end of the second sliding module 122 close to the first sliding module 121 in a flattened state is disposed with a retracting component 17, and one end of the second protective layer 142 is connected to the retracting component 17. The retracting component 17 can retract or release part of the second protective layer 142 according to the unfolded state of the sliding flexible display device 10, so that the second protective layer 142 always maintains a certain degree of tension to prevent the protective layer from folding during retracting process.

Optionally, along the sliding direction of the sliding component 12, two ends of the flexible display panel 11 are connected to a stretchable layer 18, and the stretchable layer 18 is configured to buffer a tensile force of the flexible display panel 11 when the sliding component 12 is pulled by an external force, thereby preventing the flexible display panel 11 from being damaged due to excessively strong external impact.

Optionally, along the sliding direction of the sliding component 12, both ends of the flexible display panel 11 are directly connected to a spring disposed on a back side of the flexible display panel through the stretchable layer or the protective layer (not shown in the figure), or the two ends of the flexible display panel 11 are directly connected to a spring disposed on the back side of the flexible display panel 11 to further buffer the tensile force of the flexible display panel 11 when the sliding component 12 is pulled by the external force.

Optionally, at least in the detachable area of the flexible display panel 11 and the sliding component 12, the sliding component 12 is configured to carry the surface of the flexible display panel 11. Both sides of the protective layer 14 and all the surface of the flexible display panel 11 facing the sliding component 12 are disposed with a magnetic layer to ensure that there is magnetic attraction between the sliding component 12, the protective layer 14, and the flexible display panel 11 to prevent the flexible display panel 11 and/or the protective layer 14 from arching during the process of retracting or folding the flexible display device 10.

Figure 4:
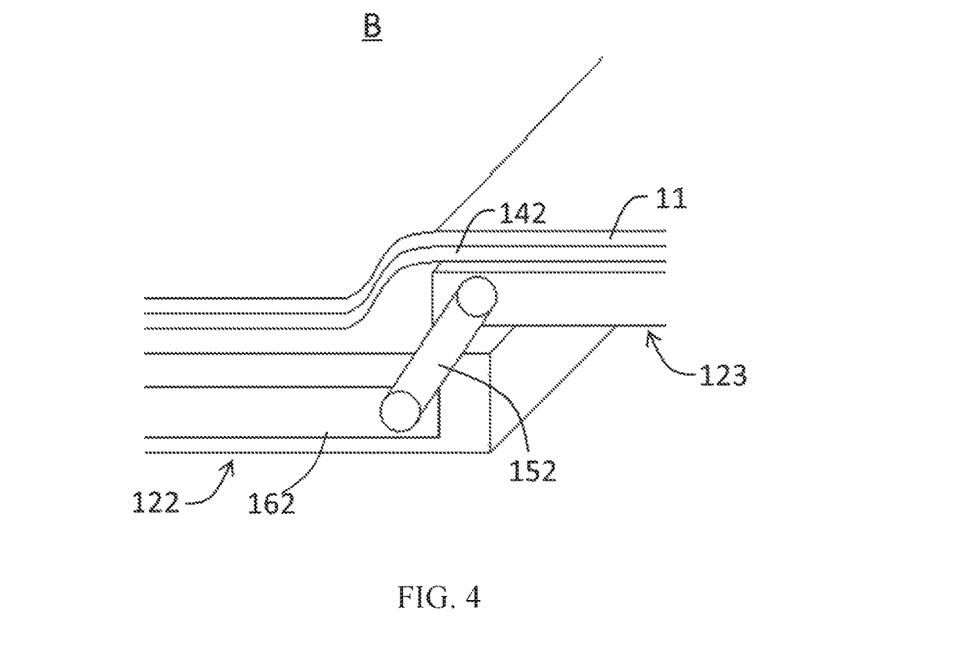
FIG. 4 is a partial schematic view of area B of the sliding flexible display device shown in FIG. 2.

Optionally, two opposite sides of the second sliding module 122 are connected to a clamping slot 19 through an elastic member 191, the clamping slot 19 and a side of second sliding module 122 are parallel, an opening of the clamping slot 19 faces the flexible display panel 11, and an edge of the flexible display panel 11 is disposed in the clamping slot 19.

Optionally, an inner wall of the clamping slot 19 is smooth, so as to reduce frictional force when the flexible display panel 11 slides in the clamping slot 19. The clamping slot 19 is configured to prevent the flexible display panel 11 from arching during the retracting or folding process of the sliding flexible display device 10. It should be noted that, when the sliding flexible display device 10 is in the flat state, the elastic member 191 pulls the clamping slot 19 tightly against the side of the second sliding module 122. During retracting or folding of the sliding flexible display device 10, the third sliding module 123 is passed between the clamping slot 19 and the second sliding module 122, and the elastic member 191 forces the clamping slot 19 to always be parallel to an edge of the second sliding module 122 and closely adhere to an edge of the third sliding module 123.

Figure 5:
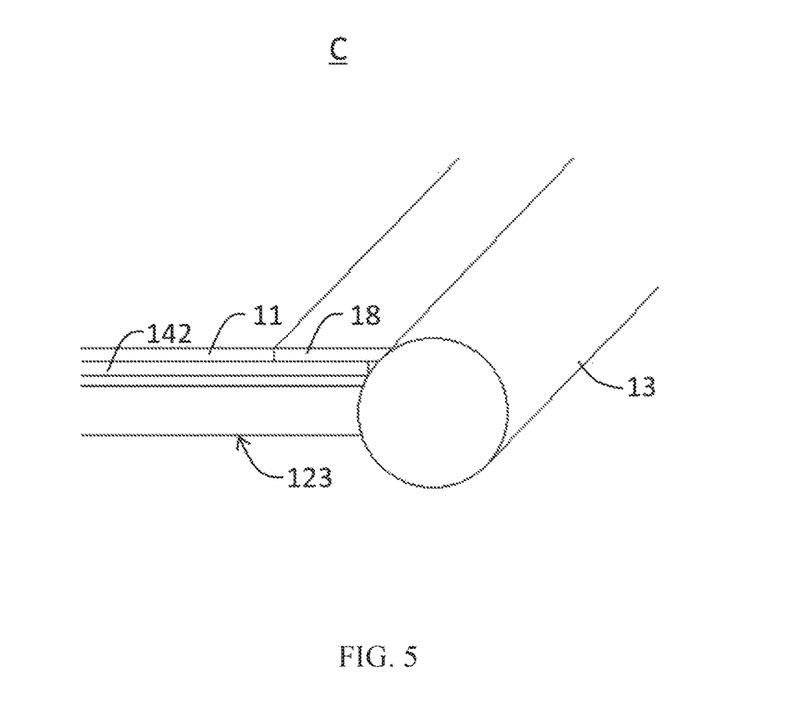
FIG. 5 is a partial schematic view of area C of the sliding flexible display device shown in FIG. 2.

Optionally, the first sliding module 121 and the second sliding module 122 are connected by a first slidably connecting rod 151, and the first sliding module 121 is disposed with a first sliding path 161. One end of the first slidably connecting rod 151 is slidably connected to the first sliding module 121 through the first sliding path 161, and the second sliding module 122 and the third sliding module 123 are connected through a second slidably connecting rod 152. The second sliding module 122 is disposed with a second sliding path 162. One end of the second slidably connecting rod 152 is slidably connected to the second sliding module 122 through the second sliding path 162. Through the arrangement of the above-mentioned slidably connecting rods and sliding paths, a slidable connection relationship between the first sliding module 121, the second sliding module 122, and the third sliding module 123 may be achieved.

Accordingly, the sliding flexible display device provided in this embodiment comprises the flexible display panel and the sliding component. During the retracting and folding process, the third sliding module retracts between the first sliding module and the second sliding module, "drawer-like" expansion and contraction are achieved, and the ultimate flexibility of the flexible display panel is fully given play. On the basis of taking into account both portability of the display device and large display screen, the dynamic continuity of the display screen of the sliding flexible display device and user experience are greatly improved.

Second Embodiment

Figure 7:
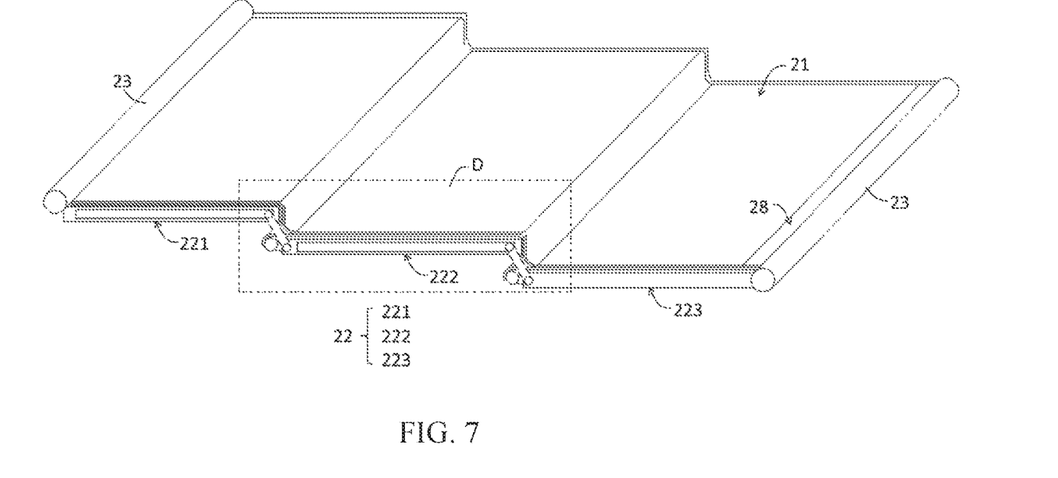
FIG. 7 is a schematic view of a sliding flexible display device disposed in an initially retracted state in a second embodiment of the present disclosure.
Figure 8:
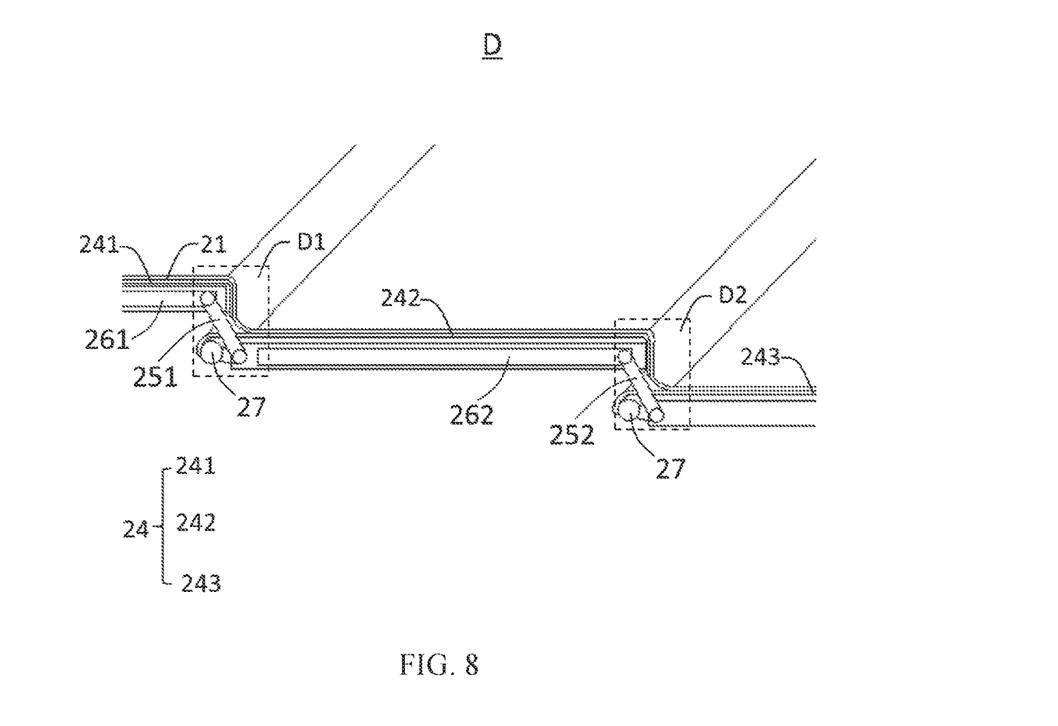
FIG. 8 is a partial schematic view of area D of the sliding flexible display device shown in FIG. 7.

As shown in FIG. 7 to FIG. 8, this embodiment provides a sliding flexible display device 20. The sliding flexible display device comprises a flexible display panel 21 and a sliding component 22 configured to carry the flexible display panel 21. The sliding component 22 comprises a first sliding module 221, a second sliding module 222, and a third sliding module 223. The first sliding module 221 and the second sliding module 222 are slidably connected, and the second sliding module 222 and the third sliding modules 223 are slidably connected. It should be noted that in this embodiment, through providing the sliding component 22 and making use of a relative sliding relationship between the three sliding modules, a transition of the sliding flexible display device 20 from a flat state to a retracted state and a folded state is achieved. In a process of retraction and folding, the flexible display panel 21 bends, and fully gives play to ultimate flexibility of the flexible display panel 21. Moreover, dynamic continuity of a display screen of the sliding flexible display device and user experience are greatly improved.

When the sliding flexible display device 20 is in the flat state, the second sliding module 222 is adjacent to the first sliding module 221 and arranged in parallel, the third sliding module 223 is adjacent to the second sliding module 222 and arranged in parallel, and the flexible display panel 21 is flattened and disposed on a flat surface formed by the plurality of sliding modules. At this time, the sliding flexible display device 20 has the largest display area and presents a better visual display effect.

When the sliding flexible display device 20 is in the retracted state, the second sliding module 222 gradually slides to the back side of the first sliding module 221, and the third sliding module 223 gradually slides to the back side of the second sliding module 222. An area of the flexible display panel 21 corresponding to the first sliding module 221 is fixed relatively to the first sliding module 221, an area of the flexible display panel 21 corresponding to the second sliding module 222 is gradually recovered in a folded state between the first sliding module 221 and the second sliding module 222 as the retraction process proceeds, and an area of the flexible display panel 21 corresponding to the third sliding module 223 is gradually recovered in a folded state between the second sliding module 222 and the third sliding module 223 as the retraction process proceeds. During retracting of the sliding flexible display device 20, its display area is gradually decreased, and space occupied by itself is also gradually decreased.

When the sliding flexible display device 20 is in the folded state, the second sliding module 222 is between the first sliding module 221 and the third sliding module 223, the area of the flexible display panel 21 corresponding to the first sliding module 221 is fixed relatively to the first sliding module 221, and the area of the flexible display panel 21 corresponding to the second sliding module 222 is gradually recovered in a folded state between the first sliding module 221 and the second sliding module 222. The area of the flexible display panel 21 corresponding to the third sliding module 223 is gradually recovered in a folded state between the second sliding module 222 and the third sliding module 223.

At this time, the display area of the sliding flexible display device 20 reaches a minimum, and only an area of the flexible display panel above the first sliding module 221 performs a display function. Space occupied by the entire sliding flexible display device 20 is minimized, and a portable feature is realized.

Optionally, a protective layer 24 is disposed between the flexible display panel 21 and the sliding component 22, and the protective layer 24 is configured to prevent the sliding component from rubbing or hitting the flexible display panel 21, that is, the flexible display panel 21 is protected during retracting or folding of the sliding flexible display device 20.

Optionally, the protective layer 24 comprises a first protective layer 241 corresponding to the first sliding module 221, a second protective layer 242 corresponding to the second sliding module 222, and a third protective layer 243 corresponding to the third sliding module 223. The first protective layer 241 extends to an edge region where the first sliding module 221 and the second sliding module 222 border, namely D1 area, and the first protective layer 241 and the first sliding module 221 in the D1 area are detachable. Except the D1 area, the first protective layer 241 and the first sliding module 221 are fixed. The second protective layer 242 extends to an edge region where the second sliding module 222 and the third sliding module 223 border, namely D2 area, and the second protective layer 242 and the second sliding module 222 are detachable. Except the D2 area, the second protective layer 242 and the second sliding module 222 are fixed. The third protective layer 243 and the third sliding module 223 are fixed. It should be noted that in the retracted and folded state of the sliding flexible display device 20, the first protective layer 241 in the D1 area and the second protective layer 242 in the D2 area naturally hang down, and is located under the flexible display panel 21 to provide a protective function.

Optionally, the protective layer 24 is a band-shaped layer disposed along both ends of the sliding component 22, or is a layer covering an entire surface of the sliding component 22.

It should be understood that, when the protective layer 24 is the band-shaped layer, the flexible display panel 21 is lifted by the protective layer 24 and does not directly contact the sliding component 22, thereby achieving the protective effect of the protective layer 24 and reducing consumables of the protective layer 24. When the protective layer 24 is a full-surface type layer, the flexible display panel 21 may be completely separated from the surface of the sliding component 22 to provide comprehensive protection for the flexible display panel 21.

Optionally, along a sliding direction of the sliding component 22, a pulling component 23 is disposed at both ends of the sliding flexible display device 20, and the pulling component 23 may be a rod-like structure or groove-like structure fixed to both ends of the sliding flexible display device 20. The pulling component 23 is configured to facilitate the user to apply an external force to the sliding flexible display device 20 to change its unfolded state.

Optionally, the second sliding module 222 is close to one end of the first sliding module 221 in the flattened state, and the third sliding module 223 is close to one end of the second sliding module 222 in the flattened state. Both ends are disposed with a retracting component 27, and one end of the second protective layer 242 and one end of the third protective layer 243 are fixed by the retracting component 27.

Optionally, along a sliding direction of the sliding component 22, two ends or one end of the flexible display panel 21 are/is connected to a stretchable layer 28, and the stretchable layer 28 is configured to buffer a tensile force of the flexible display panel 21 when the sliding component 22 is pulled by the external force, and to prevent the flexible display panel 21 from being damaged due to an excessive external force impact.

Optionally, along the sliding direction of the sliding component 22, both ends of the flexible display panel 21 are connected to a spring (not shown in the figure) from the back side of the flexible display panel 21 through the stretchable layer 28 or the protective layer 24, or the two ends of the flexible display panel 21 are directly connected to the spring disposed on the back side of the flexible display panel 21, to further buffer the tensile force of the flexible display panel 21 when the sliding component 22 is pulled by the external force.

Optionally, at least in the detachable area of the flexible display panel 21 and the sliding component 22, the sliding component 22 is configured to carry the surface of the flexible display panel 21. Both sides of the protective layer 24 and the surface of the flexible display panel 21 facing the sliding component 22 are disposed with a magnetic layer to ensure that there is magnetic attraction between the sliding component 22, the protective layer 24, and the flexible display panel 21, and to prevent the flexible display panel 21 and/or the protective layer 24 from arching during the process of retracting or folding the flexible display device 20.

Optionally, the first sliding module 221 and the second sliding module 222 are connected through a first slidably connecting rod 251, and the first sliding module 221 is disposed with a first sliding path 261. One end of the first slidably connecting rod 251 is slidably connected to the first sliding module 221 through the first sliding path 261. The second sliding module 222 and the third sliding module 223 are connected through a second slidably connecting rod 252, and the second sliding module 222 is disposed with a second sliding path 262. One end of the second slidably connecting rod 252 is slidably connected to the second sliding module 222 through the second sliding path 262. Through the arrangement of the above-mentioned slidably connecting rods and sliding paths, a slidable connection relationship between the first sliding module 221, the second sliding module 222, and the third sliding module 223 may be achieved.

In summary, the sliding flexible display device provided in this embodiment comprises the flexible display panel and the sliding component. During retracting and folding process, the second sliding module and the third sliding module are sequentially retracted to the lower side of the first sliding module and realize "stepped" contraction and stretching, and fully gives play to the ultimate flexibility of the flexible display panel. On the basis of taking into account both portability of the display device and a large display screen, the dynamic continuity of the display screen of the sliding flexible display device and user experience are greatly improved.

Third Embodiment

Figure 9:
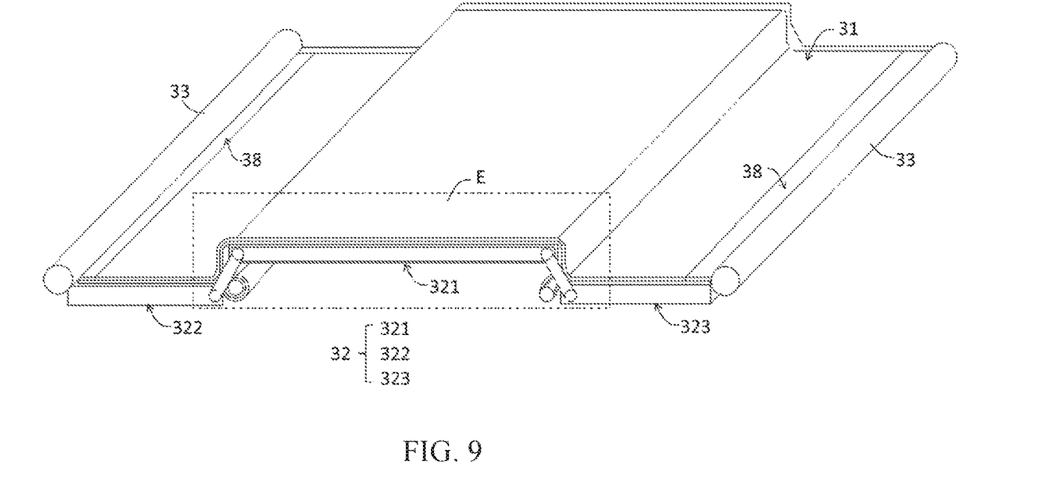
FIG. 9 is a schematic view of a sliding flexible display device disposed in an initially retracted state in a third embodiment of the present disclosure.
Figure 10:
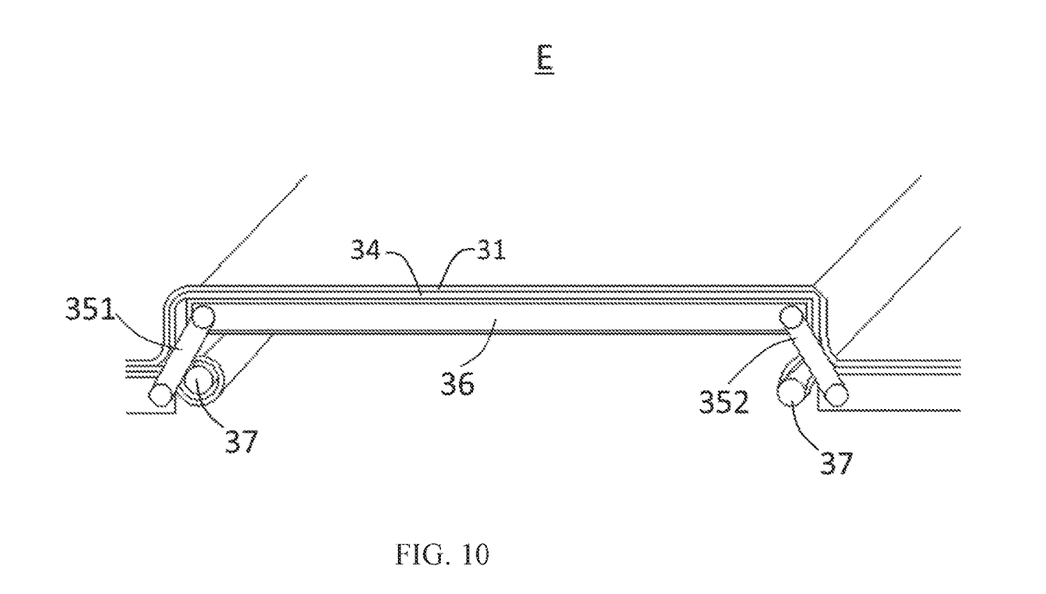
FIG. 10 is a partial schematic view of area E of the sliding flexible display device shown in FIG. 9.

As shown in FIG. 9 to FIG. 10, this embodiment provides a sliding flexible display device 30. The sliding flexible display device 30 comprises a flexible display panel 31 and a sliding component 32 for carrying the flexible display panel 31. The sliding component 32 comprises a first sliding module 321, a second sliding module 322, and a third sliding module 323. The first sliding module 321 and the second sliding module 322 are slidably connected, and the first sliding module 321 and the third sliding module 323 are slidably connected. It should be noted that in this embodiment, through providing the sliding component 32 and making use of a relative sliding relationship between the three sliding modules, a transition of the sliding flexible display device 30 from a flat state to a retracted state and a folded state is achieved. In a process of retraction and folding, the flexible display panel 31 bends, and fully gives play to ultimate flexibility of the flexible display panel 31. Moreover, dynamic continuity of a display screen of the sliding flexible display device 30 and user experience are greatly improved.

When the sliding flexible display device 30 is in a flat state, the second sliding module 322 and the third sliding module 323 are arranged in parallel on both sides of the first sliding module 321, and the flexible display panel 31 is flattened and disposed on a flat surface formed by the plurality of sliding modules. At this time, the sliding flexible display device 30 has the largest display area so as to provide a better visual display effect.

When the sliding flexible display device 30 is in the retracted state, the second sliding module 322 gradually slides to the back side of the first sliding module 321, and the third sliding module 323 gradually slides to the back side of the second sliding module 322. An area of the flexible display panel 31 corresponding to the first sliding module 321 is fixed relatively to the first sliding module 321, and an area of the flexible display panel 31 corresponding to the second sliding module 322 is gradually recovered in a folded state between the first sliding module 321 and the second sliding module 322 as the retraction process proceeds. An area of the flexible display panel 31 corresponding to the third sliding module 323 is gradually recovered in a folded state between the second sliding module 322 and the third sliding module 323 as the retraction process proceeds. During retracting of the sliding flexible display device 30, its display area is gradually decreased, and space occupied by the entire sliding flexible display device is also gradually decreased.

When the sliding flexible display device 30 is in a folded state, the second sliding module 322 and the third sliding module 323 are arranged in parallel and located at the back side of the first sliding module 321. The area of the flexible display panel 31 corresponding to the first sliding module 321 is fixed relatively to the first sliding module 321, the area of the flexible display panel 31 corresponding to the second sliding module 322 is in a folded state between the first sliding module 321 and the second sliding module 322, and the area of the flexible display panel 31 corresponding to the third sliding module 323 is in a folded state between the first sliding module 321 and the third sliding module 323. At this time, the display area of the sliding flexible display device 30 reaches a minimum, and only an area of the flexible display panel above the first sliding module 321 functions as a display. Space occupied by the entire sliding flexible display device 30 is minimized, and a portable feature is realized.

Optionally, the protective layer 34 is a band-shaped layer disposed along both edges of the sliding component 32, or is a full-surface type layer covering the surface of the sliding component 32. It should be noted that when the protective layer 34 is the band-shaped layer, the flexible display panel 31 is lifted by the protective layer 34 and does not directly contact the sliding component 32, thereby achieving the protective effect of the protective layer 34 and reducing consumables of the protective layer 34. When the protective layer 34 is the full-surface type layer, the flexible display panel 31 may be completely separated from the surface of the sliding component 32 to provide comprehensive protection for the flexible display panel 31.

Optionally, along a sliding direction of the sliding component 32, a pulling component 33 is disposed at both ends of the sliding flexible display device 30, and the pulling component 33 may be a rod-like structure or groove-like structure fixed to both ends of the sliding flexible display device 30. The pulling component 33 is configured to facilitate the user to apply an external force to the sliding flexible display device 30 to change its unfolded state.

Optionally, the second sliding module 322 is close to one end of the first sliding module 321 in the flattened state, and the third sliding module 323 is close to the second sliding module 322 in the flattened state. Both ends are disposed with a retracting component 37. The protective layer 34 penetrates the retracting component 37, and the retracting component 37 may retract or release part of the protective layer 34 based on the unfolded state of the sliding flexible display device 30, so that the protective layer 34 always keeps a certain level of tension to prevent the protective layer from folding during the retracting process.

Optionally, along the sliding direction of the sliding component 32, two ends or one end of the flexible display panel 31 are/is connected to a stretchable layer 38, and the stretchable layer 38 is configured to buffer a tensile force of the flexible display panel 31 when the sliding component 32 is pulled by the external force, and to prevent the flexible display panel 31 from being damaged due to an excessive external force impact.

Optionally, along the sliding direction of the sliding component 32, both ends of the flexible display panel 31 are connected to a spring (not shown in the figure) from the back side of the flexible display panel 31 through the stretchable layer 38 or the protective layer 34, or the two ends of the flexible display panel 31 are directly connected to the spring disposed on the back side of the flexible display panel 31, to further buffer the tensile force of the flexible display panel 31 when the sliding component 32 is pulled by the external force.

Optionally, at least in the detachable area of the flexible display panel 31 and the sliding component 32, the sliding component 32 is configured to carry the surface of the flexible display panel 31. Both sides of the protective layer 34 and the surface of the flexible display panel 31 facing the sliding component 32 are disposed with a magnetic layer to ensure that there is magnetic attraction between the sliding component 32, the protective layer 34, and the flexible display panel 31, and to prevent the flexible display panel 31 and/or the protective layer 34 from arching during the process of retracting or folding the flexible display device 30.

Optionally, the first sliding module 321 and the second sliding module 322 are connected through a first slidably connecting rod 351, and the first sliding module 321 is disposed with a sliding path 36. One end of the first slidably connecting rod 351 is slidably connected to the first sliding module 321 through the sliding path 36. The third sliding module 323 and the first sliding module 321 are connected through a second slidably connecting rod 352, and one end of the second slidably connecting rod 352 is slidably connected to the first sliding module 321 through the sliding path 36. Through the arrangement of the above-mentioned slidably connecting rods and sliding path, a slidable connection relationship between the first sliding module 321, the second sliding module 322, and the third sliding module 323 may be achieved.

Accordingly, the sliding flexible display device provided in this embodiment comprises the flexible display panel and the sliding component. During retracting and folding process, the second sliding module and the third sliding module are sequentially retracted to the lower side of the first sliding module and realize "screen-type" contraction and stretching, and fully gives play to the ultimate flexibility of the flexible display panel. On the basis of taking into account both portability of the display device and a large display screen, the dynamic continuity of the display screen of the sliding flexible display device and user experience are greatly improved.

It should be noted that although the present invention is disclosed as above with specific embodiments, the above embodiments are not intended to limit the present invention. A person skilled in the art may make various modifications without departing from the spirit and scope of the application. The scope of the present invention is determined by claims.

What is claimed is:

1. A sliding flexible display device, comprising:
a flexible display panel; and
a sliding component configured to carry the flexible display panel;
wherein the sliding component comprises a plurality of sliding modules, and a sliding connection part is disposed between the sliding modules;
wherein the sliding flexible display device comprises a flat state, a retracted state, and a folded state based on different working states of the sliding flexible display device;
wherein a protective layer disposed between the flexible display panel and the sliding component, and the protective layer is configured to prevent friction or collision of the sliding component with the flexible display panel;
wherein when the sliding flexible display device is in the folded state, a topmost of the sliding modules is a first sliding module;
wherein the protective layer and the flexible display panel corresponding to the first sliding module are fixed on the first sliding module;
wherein at least part of the protective layer corresponding to the sliding module excluding the first sliding module and at least part of the flexible display panel are detachably disposed;
when the sliding flexible display device is in the flat state, the plurality of sliding modules are arranged in parallel, and the flexible display panel is flattened and disposed on a flat surface formed by the plurality of sliding modules; or
when the sliding flexible display device is in the retracted state, a part or a whole part of the sliding modules is on a back side of another part of the sliding modules, and a part of the flexible display panel is folded and disposed between two adjacent sliding modules; or
when the sliding flexible display device is in the folded state, the plurality of sliding modules are arranged in stacks, and the flexible display panel is partially folded and disposed between the two adjacent sliding modules.

2. The sliding flexible display device according to claim 1, wherein the protective layer is a band-shaped layer disposed along both ends of the sliding component, or is a layer covering an entire surface of the sliding component.

3. The sliding flexible display device according to claim 1, wherein along a sliding direction of the sliding component, both ends of the flexible display panel are connected to a stretchable layer, and the stretchable layer is configured to buffer a tensile force of the flexible display panel when the sliding component is pulled by an external force.

4. The sliding flexible display device according to claim 3, wherein along the sliding direction of the sliding component, the both ends of the flexible display panel are directly connected to a spring disposed on a back side of the flexible display panel through the stretchable layer or the protective layer.

5. The sliding flexible display device according to claim 4, wherein at least in a detachable area of the flexible display panel and the sliding component, the sliding component is configured to carry a surface of the flexible display panel, and both sides of the protective layer and a surface of the flexible display panel facing the sliding component are provided with a magnetic layer to ensure that there is magnetic attraction between the sliding component, the protective layer, and the flexible display panel.

6. The sliding flexible display device according to claim 5, wherein the sliding modules comprise the first sliding module, a second sliding module adjacent to the first sliding module in the flat state, and a third sliding module adjacent to the second sliding module; and
wherein when the sliding flexible display device is in the folded state, the third sliding module is between the first sliding module and the second sliding module, a part of the flexible display panel is located on the first sliding module, and another part of the flexible display panel is folded between the first sliding module and the third sliding module.

7. The sliding flexible display device according to claim 6, wherein the protective layer comprises a first protective layer and a second protective layer;
wherein the first protective layer corresponds to the first sliding module, and the second protective layer corresponds to the second sliding module and the third sliding module; and
wherein the first protective layer extends to an edge region where the first sliding module and the second sliding module meet, and the first protective layer and the first sliding module are detachable in the edge region.

8. The sliding flexible display device according to claim 7, wherein the second sliding module in the flat state close to one end of the first sliding module is provided with a retracting component, and one end of the second protective layer is connected to the retracting component.

9. The sliding flexible display device according to claim 6, wherein two opposite sides of the second sliding module are connected to a clamping slot through an elastic member, the clamping slot and a side of second sliding module are parallel, an opening of the clamping slot faces the flexible display panel, and an edge of the flexible display panel is disposed in the clamping slot.

10. The sliding flexible display device according to claim 6, wherein the first sliding module and the second sliding module are connected through a first slidably connecting rod, the first sliding module is provided with a first sliding path, and one end of the first slidably connecting rod is slidably connected to the first sliding module through the first sliding path.

11. The sliding flexible display device according to claim 10, wherein the second sliding module and the third sliding module are connected through a second slidably connecting rod, the second sliding module is provided with a second sliding path, and one end of the second slidably connecting rod is slidably connected to the second sliding module through the second sliding path.

12. The sliding flexible display device according to claim 5, wherein the sliding modules comprise the first sliding module, a second sliding module adjacent to the first sliding module in the flat state, and a third sliding module adjacent to the second sliding module; and when the sliding flexible display device is in the folded state, the second sliding module is between the first sliding module and the third sliding module, a part of the flexible display panel is located on the first sliding module, and another part of the flexible display panel is folded between the first sliding module and the second sliding module, and folded between the second sliding module and the third sliding module.

13. The sliding flexible display device according to claim 12, wherein the first sliding module and the second sliding module are connected through a first slidably connecting rod, the first sliding module is provided with a first sliding path, and one end of the first slidably connecting rod is slidably connected to the first sliding module through the first sliding path.

14. The sliding flexible display device according to claim 13, wherein the second sliding module and the third sliding module are connected through a second slidably connecting rod, the second sliding module is provided with a second sliding path, and one end of the second slidably connecting rod is slidably connected to the second sliding module through the second sliding path.

15. The sliding flexible display device according to claim 5, wherein the sliding modules comprise the first sliding module, a second sliding module adjacent to the first sliding module in the flat state, and a third sliding module adjacent to the second sliding module;
wherein when the sliding flexible display device is in the folded state, the second sliding module and the third sliding module are disposed side by side on a back side of the first sliding module; and
wherein a part of the flexible display panel is located on the first sliding module, and another part of the flexible display panel is folded between the first sliding module and the second sliding module, and folded between the first sliding module and the third sliding module.

16. The sliding flexible display device according to claim 15, wherein the second sliding module and the first sliding module are connected through a first slidably connecting rod, and the third sliding module and the first sliding module are connected through a second slidably connecting rod; and
wherein the first sliding module is provided with a common sliding path, one end of the first slidably connecting rod is slidably connected to the first sliding module through the common sliding path, and one end of the second slidably connecting rod is slidably connected to the first sliding module through the common sliding path.

17. The sliding flexible display device according to claim 1, wherein along a sliding direction of the sliding component, two opposite ends of the flexible display panel in the flat state are provided with a stretchable component, the stretchable component is configured to apply an external force to the sliding flexible display device, and the sliding flexible display device in an unfolded state is changed.

* * * * *

UNITED STATES PATENT AND TRADEMARK OFFICE
CERTIFICATE OF CORRECTION

| | |
|---|---|
| PATENT NO. | : 11,395,421 B2 |
| APPLICATION NO. | : 16/980864 |
| DATED | : July 19, 2022 |
| INVENTOR(S) | : Wenqi Li |

It is certified that error appears in the above-identified patent and that said Letters Patent is hereby corrected as shown below:

On the Title Page

Item [73]:
"Wuhan China Star Optoeleetronics Semiconductor Display Technology Co., Ltd."
Should be changed to:
-- Wuhan China Star Optoelectronics Semiconductor Display Technology Co., Ltd. --

Signed and Sealed this
Eleventh Day of April, 2023

Katherine Kelly Vidal
*Director of the United States Patent and Trademark Office*